United States Patent
Won et al.

(10) Patent No.: US 10,909,052 B2
(45) Date of Patent: Feb. 2, 2021

(54) MEMORY SYSTEM CAPABLE OF TRANSMITTING DATA DIRECTLY BETWEEN MEMORY DEVICES

(71) Applicant: SK hynix Inc., Icheon (KR)

(72) Inventors: Hyung Sik Won, Cheongju (KR); Young Jung Choi, Eumseong-gun (KR)

(73) Assignee: SK hynix Inc., Icheon (KR)

( * ) Notice: Subject to any disclaimer, the term of this patent is extended or adjusted under 35 U.S.C. 154(b) by 27 days.

(21) Appl. No.: 16/287,990

(22) Filed: Feb. 27, 2019

(65) Prior Publication Data

US 2020/0142841 A1    May 7, 2020

(30) Foreign Application Priority Data

Nov. 5, 2018   (KR) .................. 10-2018-0134170

(51) Int. Cl.
*G06F 13/16*    (2006.01)
*G11C 11/4096*  (2006.01)
*G06F 3/06*     (2006.01)

(52) U.S. Cl.
CPC .......... *G06F 13/1668* (2013.01); *G06F 3/064* (2013.01); *G06F 3/0679* (2013.01); *G11C 11/4096* (2013.01)

(58) Field of Classification Search
CPC .... G04F 3/064; G04F 3/0679; G04F 13/1668; G11C 7/1006; G11C 7/1096; G11C 7/1069; G11C 7/1045; G11C 7/1048; G11C 11/4096; G11C 2207/105; G11C 2207/108

See application file for complete search history.

(56) References Cited

U.S. PATENT DOCUMENTS

| | | |
|---|---|---|
| 5,757,795 A | 5/1998 | Schnell |
| 7,899,052 B1 | 3/2011 | Hao et al. |
| 9,952,925 B2 | 4/2018 | Lea et al. |
| 9,983,821 B2 | 5/2018 | Sala et al. |
| 2009/0271366 A1 | 10/2009 | Ellison et al. |
| 2013/0265883 A1 | 10/2013 | Henry et al. |
| 2014/0115579 A1 | 4/2014 | Kong |
| 2014/0208022 A1 | 7/2014 | Gordon |
| 2016/0283303 A1 | 9/2016 | Sharma et al. |
| 2017/0091003 A1 | 3/2017 | Das Sharma et al. |
| 2017/0358327 A1 | 12/2017 | Oh et al. |

(Continued)

FOREIGN PATENT DOCUMENTS

EP    0464848 A2    1/1992

OTHER PUBLICATIONS

Notice of Allowance dated Aug. 5, 2020 for U.S. Appl. No. 16/367,700.
Office Action dated Nov. 20, 2020 for U.S. Appl. 16/858,414.

*Primary Examiner* — Gary W. Cygiel (57) ABSTRACT

A memory system includes a memory controller configured to generate a memory control signal for controlling a read operation or a write operation of data, and a plurality of memory devices configured to perform the read operation or the write operation in response to the memory control signal. A first memory device stores a first number of data received from the memory controller, and a second memory device receives a second number of data corresponding to a specific number of data from among the first number of data, copies the second number of data to generate a third number of data, and stores the third number of data in the second memory device.

20 Claims, 9 Drawing Sheets

(56) References Cited

U.S. PATENT DOCUMENTS

| | | |
|---|---|---|
| 2017/0364287 A1 | 12/2017 | Antony et al. |
| 2017/0364428 A1 | 12/2017 | Ganesan et al. |
| 2018/0225254 A1 | 8/2018 | Hu et al. |
| 2020/0026469 A1 | 1/2020 | Gao et al. |

MEMORY SYSTEM CAPABLE OF TRANSMITTING DATA DIRECTLY BETWEEN MEMORY DEVICES

CROSS-REFERENCE TO RELATED APPLICATION

This application claims priority under 35 U.S.C. 119(a) to Korean patent application No. 10-2018-0134170, filed on Nov. 5, 2018, the disclosure of which is incorporated in its entirety by reference herein.

BACKGROUND OF THE INVENTION

1. Technical Field

Embodiments of the present disclosure relate to a memory system, and more particularly to technology for implementing data communication between memory devices.

2. Related Art

In recent times, various mobile communication terminals, for example, smartphones, tablet PCs, etc., have been widely used throughout the world. In addition, demand for a Social Network Service (SNS), a Machine to Machine (M2M) service, a sensor network, etc. from anywhere at any time is rapidly increasing. Therefore, an amount of data, a speed of creating data, and diversity of data are geometrically increasing. In order to process a large amount of data, a data processing rate of each memory is of importance, and a high-capacity memory device and a high-capacity memory module are also needed.

Therefore, a memory system includes a plurality of memory devices to increase storage capacity. The memory devices of the memory system may be coupled to a controller through data lines. However, when a large number of memory devices are included in the memory system, a data loading time is rapidly increasing. In addition, during data communication between the controller and the memory devices, a data transfer time and power consumption increase.

BRIEF SUMMARY OF THE INVENTION

Various embodiments of the present disclosure are directed to providing a memory system that substantially obviates one or more problems due to limitations and disadvantages of the related art.

Embodiments of the present disclosure relate to a memory system for implementing direct transmission of data between memory devices by sharing one or more data lines between the memory devices, and allowing data received through the shared one or more data lines to be copied in each of the memory devices, resulting in reduction in a data transfer time and power consumption.

In accordance with an embodiment of the present disclosure, a memory system includes a memory controller configured to generate a memory control signal for controlling a read operation or a write operation of data, and a plurality of memory devices configured to perform the read operation or the write operation in response to the memory control signal. The plurality of memory devices includes a first memory device and a second memory device. The first memory device stores a first number of data received from the memory controller, and the second memory device receives a second number of data corresponding to a specific number of data from among the first number of data, copies the second number of data to generate a third number of data and stores the third number of data in the second memory device, the third number of data being greater than the second number of data.

In accordance with another embodiment of the present disclosure, a memory system includes a first memory device and a second memory device. The first memory device performs a read operation or a write operation of data in response to a memory control signal, and stores a first number of data received through a first data bus and a second data bus. The second memory device receives, through the second data bus, a second number of data corresponding to a specific number of data from among the first number of data from the first memory device, copies the second number of data to generate a third number of data, and stores the number of data in the second memory device, the third number of data being greater than the second number of data.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. The same or like reference numbers refer to the same or like portions throughout the various drawings and embodiments of the present disclosure. Throughout the specification of the present disclosure, if it is assumed that a certain part is connected (or coupled) to another part, the term "connection or coupling" means that the certain part is directly connected (or coupled) to another part and/or is electrically connected (or coupled) to another part through the medium of a third party. Throughout the specification of the present disclosure, if it is assumed that a certain part includes a certain component, the term "comprising or including" means that a corresponding component may further include other components unless a specific meaning opposed to the corresponding component is written. As used in the specification and appended claims, the terms "a," "an," "one," "the," and other similar terms include both singular and plural forms, unless context clearly dictates otherwise. The terms used in the present disclosure are merely used to describe specific embodiments and are not intended to limit the present disclosure. A singular expression may include a plural expression unless otherwise stated in the context.

Figure 1:
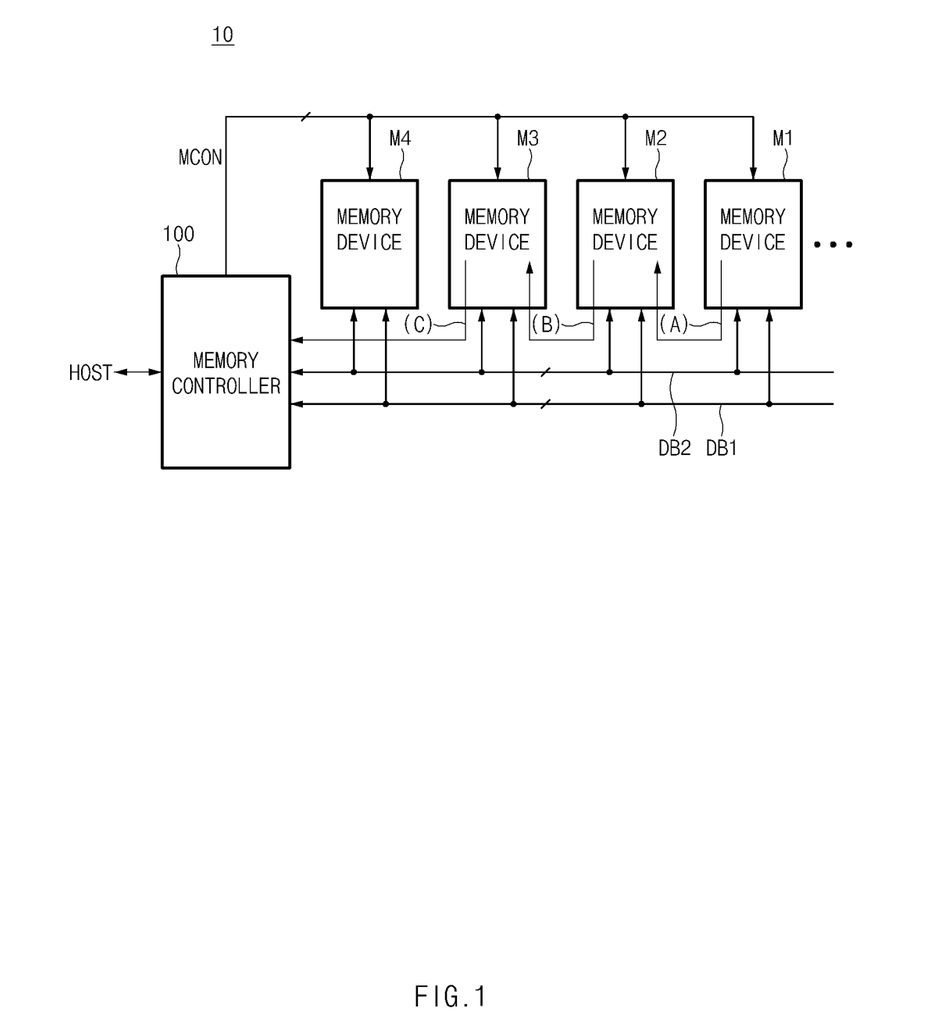
FIG. 1 illustrates a memory system according to an embodiment of the present disclosure.

FIG. 1 illustrates a memory system 10 according to an embodiment of the present disclosure.

Referring to FIG. 1, the memory system 10 may include a memory controller 100 and a plurality of memory devices M1~M4.

The memory controller 100 may receive a command from a host, and may generate a memory control signal MCON based on the command received from the host to thereby control the plurality of memory devices M1~M4. The memory controller 100 may include a host interface (not shown) to interface with the host.

For example, the memory controller 100 may analyze and process the command received from the host. In this case, the command received from the host may include a write command to write data in the memory devices M1~M4, a read command to read data stored in the memory devices M1~M4, or the like.

Upon receiving the command from the host, the memory controller 100 may control operations of background functional blocks according to firmware or software for driving the memory devices M1~M4.

The memory devices M1~M4 may provide data services upon receiving the memory control signal MCON from the memory controller 100. For example, in response to the memory control signal MCON, the memory devices M1~M4 may store data received from the memory controller 100, or may read data stored therein and provide the read data to the memory controller 100.

Although the embodiment of the present disclosure has exemplarily disclosed that the four memory devices M1~M4 are used for convenience of description and better understanding of the present disclosure, the scope or spirit of the present disclosure is not limited thereto. In other embodiments, the number of memory devices included in the memory system 10 may be changed as necessary.

In addition, each of the memory devices M1~M4 may be a volatile memory. However, the scope or spirit of the present disclosure is not limited thereto, and thus each of the memory devices M1~M4 may be implemented as a nonvolatile memory such as any one of a NAND flash memory, a NOR flash memory, a phase-change RAM (PCRAM), a ferroelectric RAM (FRAM), a magnetic RAM (MRAM), etc.

The memory devices M1~M4 may be coupled to the memory controller 100 through data buses DB1 and DB2, such that the memory devices M1~M4 may transmit and receive data to and from the memory controller 100. In this case, the memory devices M1~M4 may share data received through the data bus DB2 with each other.

That is, data may be directly transmitted between the memory devices M1~M4 through the data bus DB2 without passing through the memory controller 100.

The memory devices M1~M4 may share the data bus DB2 through which some of data can be transmitted. For example, the memory device M1 from among the memory devices M1~M4 may directly transmit data to the memory device M2 through the data bus DB2 without using the memory controller 100, as represented by a transmission path (A). Similarly, the memory device M2 from among the memory devices M1~M4 may directly transmit data to the memory device M3 through the data bus DB2 without using the memory controller 100, as represented by a transmission path (B). The memory device M1~M4 may transmit the read data to the memory controller 100 through the data buses DB1 and DB2, as represented by a transmission path (C).

Figure 2:
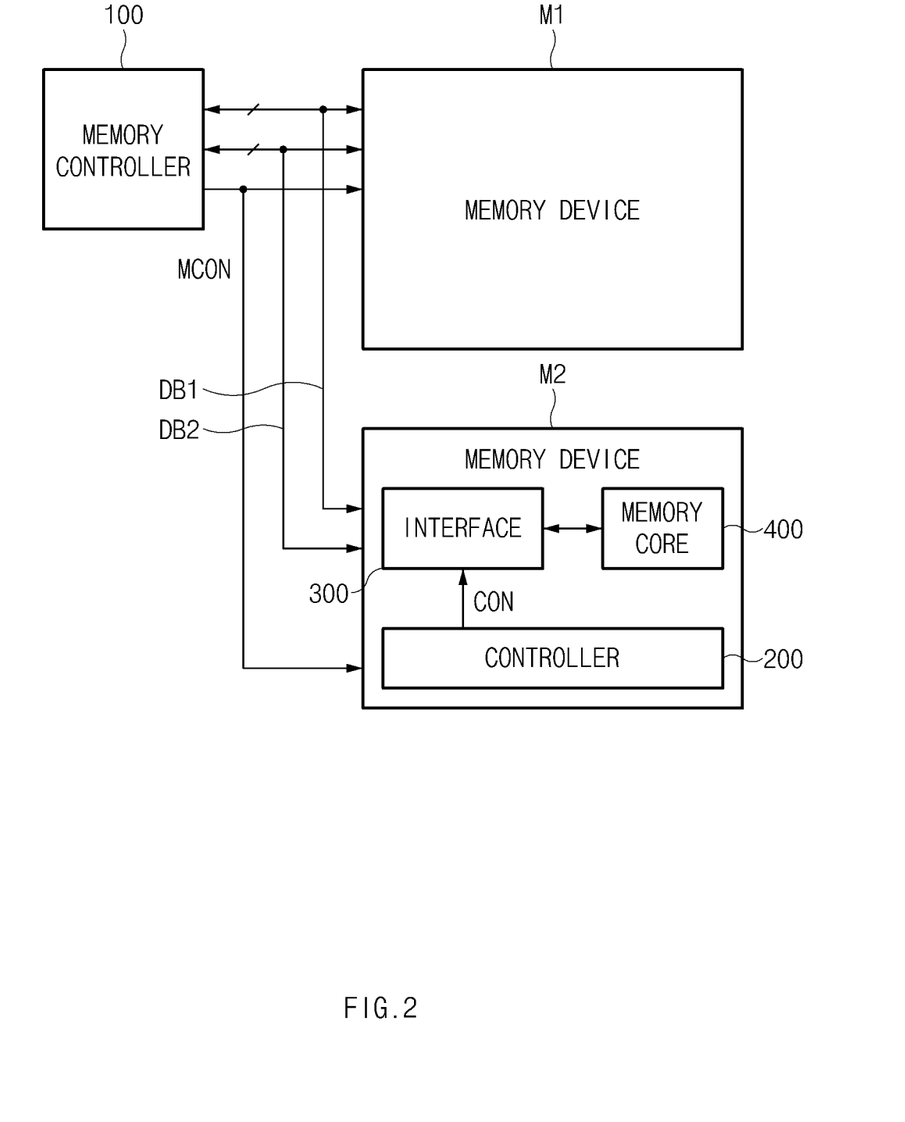
FIG. 2 illustrates a memory device shown in FIG. 1 according to an embodiment of the present disclosure.

FIG. 2 illustrates each of the memory devices M1~M4 shown in FIG. 1 according to an embodiment of the present disclosure. The memory devices M1~M4 are identical in structure to each other, such that only two memory devices M1 and M2 are shown in FIG. 2 for convenience of description, and this embodiment will hereinafter be described with reference to a detailed structure of the memory device M2 as an example.

Referring to FIG. 2, the memory device M2 may include a controller 200, an interface 300, and a memory core 400.

In response to the memory control signal MCON from the memory controller 100, the controller 200 may generate a control signal CON for determining a control mode of data in the memory device M2. For example, in response to the memory control signal MCON, the controller 200 may output the control signal CON to set a normal mode or a compression mode.

The interface 300 may perform interfacing between the memory core 400 and the data buses DB1 and DB2 in response to the control signal CON. The interface 300 may include a first connection circuit to select both of the data buses DB1 and DB2 in response to the control signal CON, and a second connection circuit to select only the data bus DB2 in response to the control signal CON.

For example, when the control signal CON is set to the normal mode, the interface 300 may receive the entire data through the data buses DB1 and DB2, and may transmit the received entire data to the memory core 400. On the other hand, when the control signal CON is set to the compression mode, the interface 300 may receive some of the entire data, e.g., partial data, through the data bus DB2, and may transmit the receive partial data to the memory core 400.

In the normal mode, the memory core 400 may receive the entire data from the data buses DB1 and DB2 through the interface 300, and may store the received entire data in a bank of the memory device M2 that is to be described later. In the compression mode, the memory core 400 may receive some of the entire data, i.e., the partial data, from the data bus DB2 through the interface 300. The memory core 400 may store data corresponding to the entire data in the bank of the memory device M2 by copying the partial data received through the interface 300. Data loaded in the data bus DB2 may be directly transmitted to each of the memory devices M1 and M2 without passing through the memory controller 100.

For example, the memory device M1 may operate in the normal mode so that a read or write operation for the entire data can be carried out. In addition, when the memory device M1 performs the read or write operation in the normal mode, the memory device M2 may operate in the compression mode to store data corresponding to the entire data by copying the partial data. In this case, the memory controller 100 may provide the memory device M1 and the memory device M2 with the same data.

As described above, the memory device M2 may copy the partial data received through the data bus DB2 in the memory core 400 of the memory device M2 in response to the memory control signal MCON, and may store the copied data in the memory core 400.

Therefore, according to the embodiments of the present disclosure, data can be directly transmitted between the memory devices, and only some of the entire data is received and copied to generate parallel data, and the parallel data is stored in a memory device. As a result, a data transfer time and power consumption can be reduced.

Figure 3:
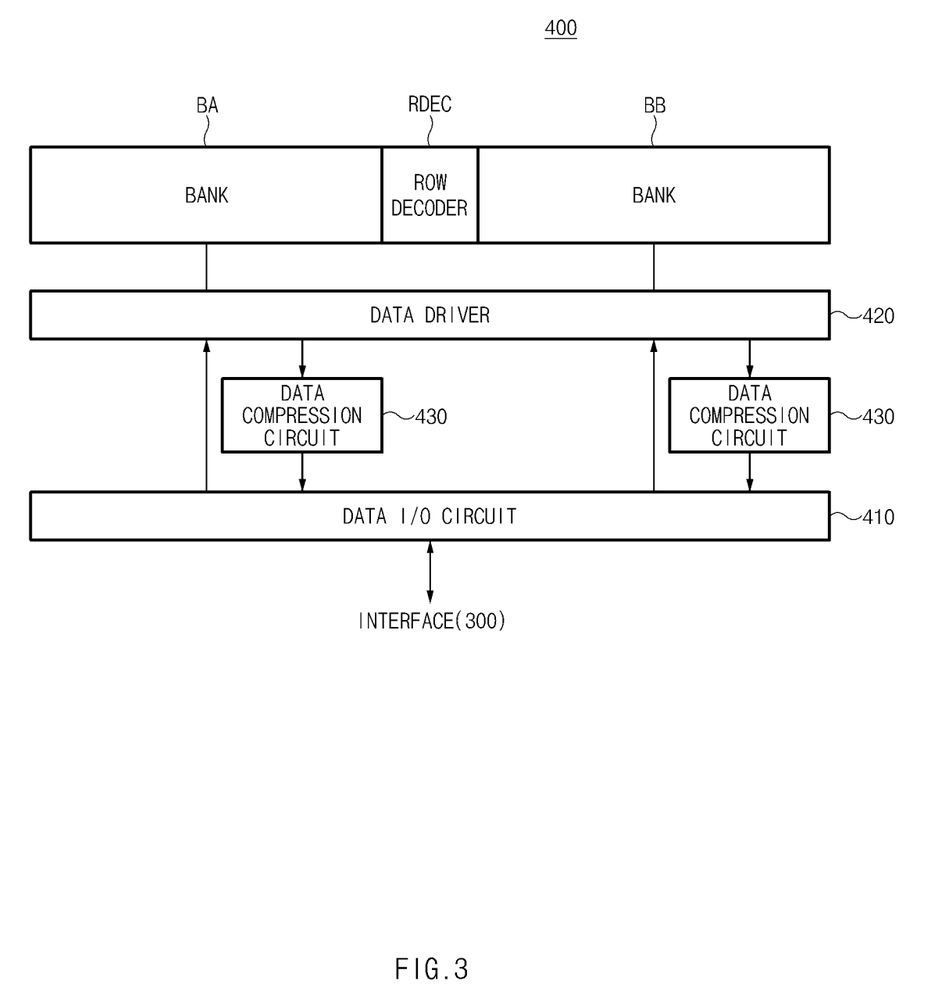
FIG. 3 illustrates a memory core shown in FIG. 2 according to an embodiment of the present disclosure.

FIG. 3 illustrates the memory core 400 shown in FIG. 2 according to an embodiment of the present disclosure.

Referring to FIG. 3, the memory core 400 may include a data input/output (I/O) circuit 410, a data driver 420, a data compression circuit 430, a row decoder RDEC, and a plurality of banks BA and BB.

FIG. 3 shows the two banks BA and BB that are included in the memory core 400 for convenience of description and better understanding of the present disclosure. However, the scope or spirit of the present disclosure is not limited thereto, and the number of banks may be changed as necessary.

In this case, the data I/O circuit 410 may communicate with the interface 300 of the memory device M2, shown in FIG. 2. That is, during a write operation, the data I/O circuit 410 may transmit write data received through the interface 300 to the data driver 420. During a read operation, the data I/O circuit 410 may transmit read data received through the data compression circuit 430 to the interface 300.

During the write operation, the data driver 420 may drive the write data received from the data I/O circuit 410, and may transmit the write data to the banks BA and BB. During the read operation, the data driver 420 may drive the read data received from the banks BA and BB, and may transmit the read data to the data compression circuit 430.

During the read operation, the data compression circuit 430 may compress the read data received from the data driver 420, and may transmit the compressed read data to the data I/O circuit 410. That is, the read data received from the banks BA and BB may be compressed by the data compression circuit 430, and the compressed read data may be transmitted to the data I/O circuit 410. The compressed read data, which is output through the data I/O circuit 420, is transmitted to the data bus DB2 through the interface 300, such that a data loading time caused by data transmission can be reduced in the read operation.

During the write operation, the banks BA and BB may store the write data received from the data driver 420. During the read operation, each of the banks BA and BB may read the stored data, and may output the read data to the data driver 420. During the write operation or the read operation, the row decoder RDEC may select row lines of the respective banks BA and BB, and may allow cells to which the selected row lines are coupled to be accessed.

Figure 4:
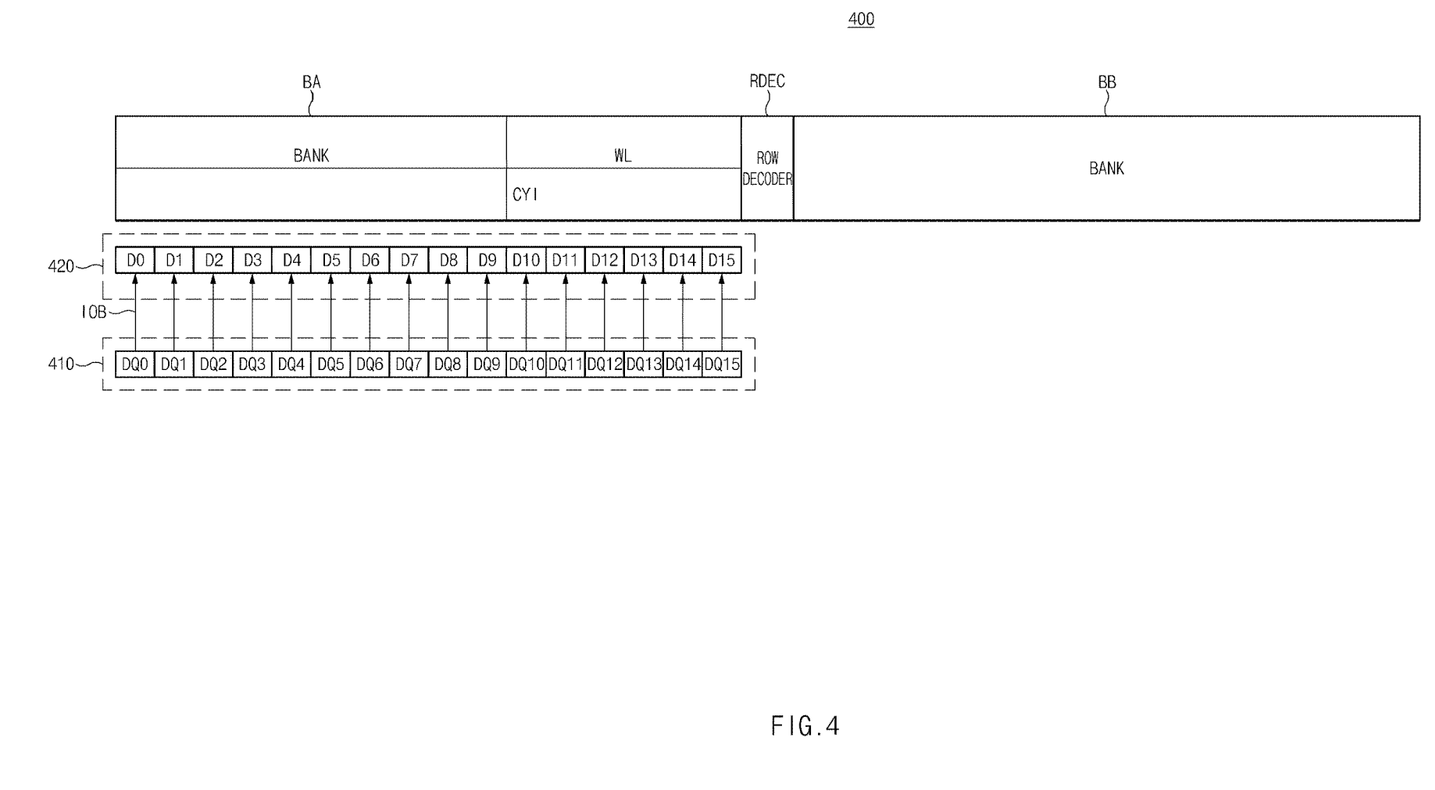
FIG. 4 illustrates a memory core shown in FIG. 3 according to an embodiment of the present disclosure.

FIG. 4 illustrates an example of the memory core 400 shown in FIG. 3 according to an embodiment of the present disclosure.

Referring to FIG. 4, the memory core 400 may include a data I/O circuit 410, a data driver 420, a row decoder RDEC, and banks BA and BB.

The embodiment of FIG. 4 will hereinafter be described focusing upon a write operation of data. In an embodiment, data, which has been read from a reference memory device, for example, the memory device M1 shown in FIG. 2, may be stored in a target memory device, for example, the memory device M2 shown in FIG. 2. In this embodiment, the data read from the memory device M1 is stored in the memory core 400 of FIG. 4.

In addition, the embodiment of FIG. 4 discloses an exemplary case in which the control signal CON from the controller 200 shown in FIG. 2 is set to the normal mode. In the normal mode, the memory core 400 may receive the entire data of the data buses DB1 and DB2 through the interface 300 shown in FIG. 2, and may store the received entire data in a bank, e.g., the bank BA. The embodiment of FIG. 4 exemplarily discloses that the received entire data is stored in the bank BA from among the banks BA and BB for convenience of description. However, the scope or spirit of the present disclosure is not limited thereto, and the received entire data may be stored in the bank BB from among the banks BA and BB or in both of the banks BA and BB, as necessary.

For example, it is assumed that first data received through the data bus DB1 is denoted by (×12) and second data received through the data bus DB2 is denoted by (×4). As a result, the entire data received through the data buses DB1 and DB2 may be denoted by (×16). That is, the entire data includes the first data and the second data. However, the scope or spirit of the present disclosure is not limited thereto, and the number of data segments to be transmitted through the data buses DB1 and DB2 may be changed as necessary.

During the normal mode, the interface 300 may transmit the entire data denoted by (×16) to the data I/O circuit 410 of the memory core 400. In other words, when a total number of data pins of the memory core 400 is 16, 16 data DQ0~DQ15 received through the 16 data pins may be input to the data I/O circuit 410. The data I/O circuit 410 may receive the 16 data DQ0~DQ15 from the interface 300, and may transmit the received data DQ0~DQ15 to an internal I/O bus IOB.

As a result, the data driver 420 may drive the data DQ0~DQ15 received through the internal I/O bus IOB, and may transmit data D0~D15 corresponding to the data DQ0~DQ15, respectively, to the bank BA. The bank BA may store the data D0~D15 received through the data driver 420. When a word line WL is selected by the row decoder RDEC and a column line is selected by a column selection signal CYI, the bank BA may write each of the data D0~D15 in a corresponding cell designated by the selected word line WL and the selected column line.

Figure 5:
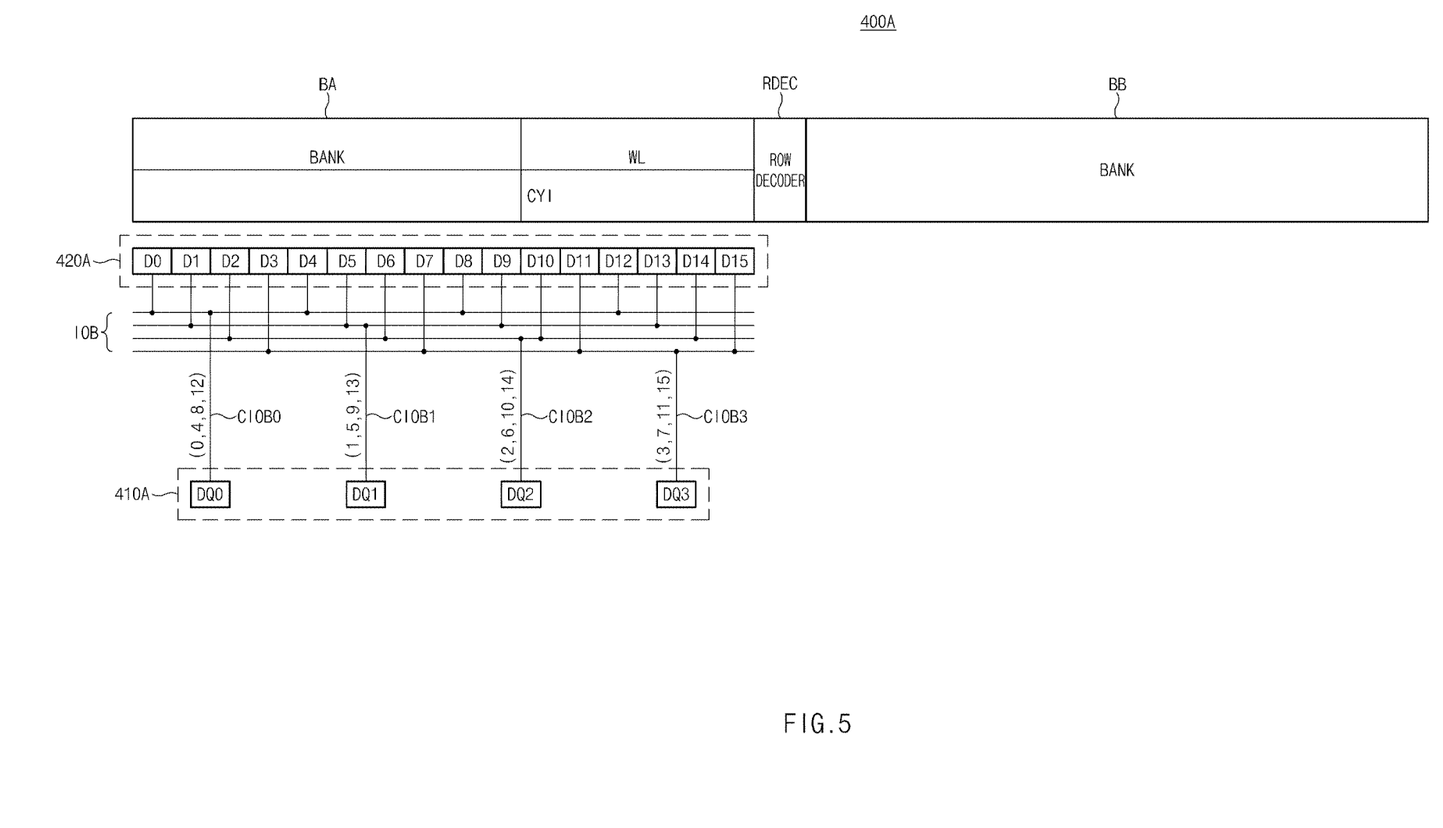
FIG. 5 illustrates a memory core shown in FIG. 3 according to another embodiment of the present disclosure.

FIG. 5 illustrates another example of the memory core 400 shown in FIG. 3 according to another embodiment of the present disclosure.

Referring to FIG. 5, a memory core 400A may include a data I/O circuit 410A, a data driver 420A, a row decoder RDEC, and banks BA and BB.

The embodiment of FIG. 5 will hereinafter be described focusing upon a write operation of data for convenience of description. Data, which has been read from a reference memory device, for example, the memory device M1 shown in FIG. 2, may be stored in a target memory device, for example, the memory device M2 shown in FIG. 2. In this embodiment, the data read from the memory device M1 is stored in the memory core 400A.

In addition, the embodiment of FIG. 5 discloses an exemplary case in which the control signal CON from the controller 200 shown in FIG. 2 is set to the compression mode. In the compression mode, the memory core 400A may receive some of the entire data of the data buses DB1 and DB2 through the interface 300 shown in FIG. 2, and may store the received data in the bank BA. The embodiment of FIG. 5 discloses that the received data is stored in the bank BA from among the banks BA and BB for convenience of description. However, the scope or spirit of the present disclosure is not limited thereto, and the received data may be stored in the bank BB from among the banks BA and BB or in both of the banks BA and BB, as necessary.

For example, it is assumed that data received through the data bus DB1 is denoted by (×12) and data received through the data bus DB2 is denoted by (×4). In the compression mode, the interface 300 may transmit only the data denoted by (×4) and received through the data bus DB2 to the memory core 400A.

The data I/O circuit 410A may receive four data DQ0~DQ3 from the interface 300, and may transmit the received data DQ0~DQ3 to common I/O buses CIOB0~CIOB3. The data DQ0~DQ3 applied to the common I/O buses CIOB0~CIOB3 may be copied through an internal I/O bus IOB, such that data D0~D15 corresponding to the data DQ0~DQ3 may be transmitted to the bank BA.

For example, the data DQ0 applied to the common I/O bus CIOB0 may be copied into several data D0, D4, D8, and D12 through the internal I/O bus IOB. The data DQ1 applied to the common I/O bus CIOB1 may be copied into several data D1, D5, D9, and D13 through the internal I/O bus IOB. The data DQ2 applied to the common I/O bus CIOB2 may be copied into several data D2, D6, D10, and D14 through the internal I/O bus IOB. In addition, the data DQ3 applied to the common I/O bus CIOB3 may be copied into several data D3, D7, D11, and D15 through the internal I/O bus IOB.

Therefore, the 16 data D0~D15 may be applied to the bank BA through the internal I/O bus IOB. The data driver 420A may drive the data D0~D15 received through the internal I/O bus IOB, and may transmit the data D0~D15 to the bank BA. In the bank BA, a word line WL may be selected by the row decoder RDEC, and a column line may be selected by a column selection signal CYI, such that the data D0~D15 may be stored in corresponding cells of the bank BA.

Figure 6:
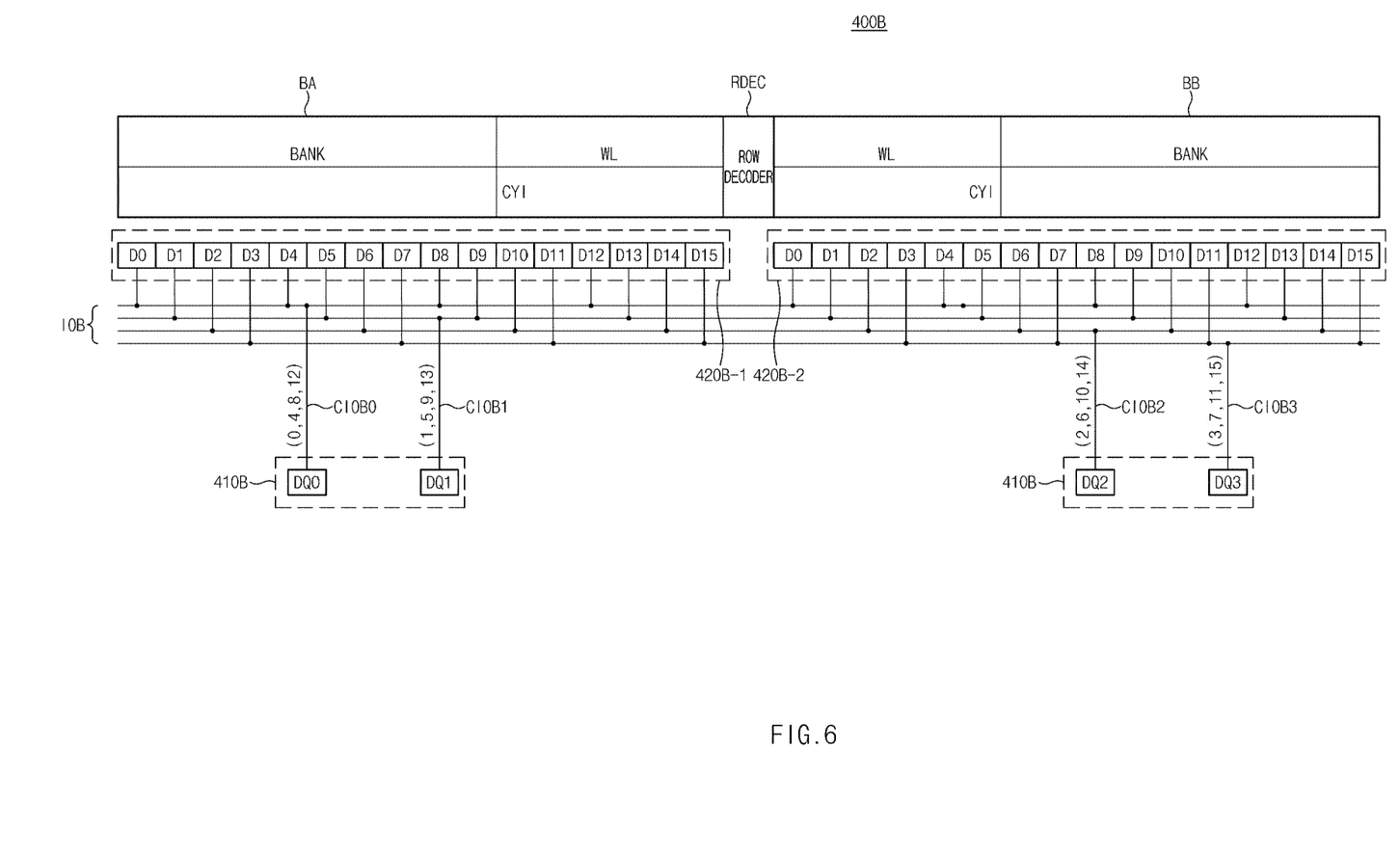
FIG. 6 illustrates a memory core shown in FIG. 3 according to another embodiment of the present disclosure.

FIG. 6 illustrates another example of the memory core 400 shown in FIG. 2 according to an embodiment of the present disclosure.

Referring to FIG. 6, a memory core 400B may include data I/O circuit 410B, data drivers 420B-1 and 420B-2, a row decoder RDEC, and banks BA and BB.

The embodiment of FIG. 6 will hereinafter be described focusing upon a write operation of data for convenience of description. Data, which has been read from a reference memory device, for example, the memory device M1 shown in FIG. 2, may be stored in a target memory device, for example, the memory device M2 shown in FIG. 2. In this embodiment, the data read from the memory device M1 is stored in the memory core 400B.

In addition, the embodiment of FIG. 6 discloses an exemplary case in which the control signal CON from the controller 200 shown in FIG. 2 is set to the compression mode. In the compression mode, the memory core 400B may receive data of the data bus DB2 through the interface 300 shown in FIG. 2, and may store the received data in the banks BA and BB. The embodiment of FIG. 6 discloses that the received data is stored in both of the banks BA and BB for convenience of description.

For example, it is assumed that data received through the data bus DB1 is denoted by (×12) and data received through the data bus DB2 is denoted by (×4). In the compression mode, the interface 300 may transmit the data denoted by (×4) and received through the data bus DB2 to the memory core 400B.

The data I/O circuit 410B may receive four data DQ0~DQ3 from the interface 300 at a time, and may transmit the received data DQ0~DQ3 to common I/O buses CIOB0~CIOB3. The data DQ0~DQ3 applied to the common I/O buses CIOB0~CIOB3 may be copied through an internal I/O bus JOB, such that data D0~D15 corresponding to the data DQ0~DQ3 may be transmitted not only to the bank BA but also to the bank BB.

For example, the data DQ0 applied to the common I/O bus CIOB0 may be copied into several data D0, D4, D8, and D12 through the internal I/O bus JOB. The data DQ1 applied to the common I/O bus CIOB1 may be copied into several data D1, D5, D9, and D13 through the internal I/O bus JOB. The data DQ2 applied to the common I/O bus CIOB2 may be copied into several data D2, D6, D10, and D14 through the internal I/O bus JOB. In addition, the data DQ3 applied to the common I/O bus CIOB3 may be copied into several data D3, D7, D11, and D15 through the internal I/O bus JOB.

Therefore, the 16 data D0~D15 may be applied to the bank BA through the internal I/O bus JOB. Similarly, the 16 data D0~D15 may be applied to the bank BB through the internal I/O bus JOB. Each of the data drivers 420B-1 and 420B-2 may drive the data D0~D15 received through the internal I/O bus JOB, and may transmit the data D0~D15 to a corresponding one of the banks BA and BB.

In the bank BA, a word line WL may be selected by the row decoder RDEC, and a column line may be selected by a column selection signal CYI, such that the data D0~D15 may be stored in corresponding cells of the bank BA. Similarly, in the bank BB, a word line WL may be selected by the row decoder RDEC, and a column line may be selected by a column selection signal CYI, such that the data D0~D15 may be stored in corresponding cells of the bank BB. In this case, the bank BA and the bank BB may be simultaneously accessed such that the write operation of the data D0~D15 can be carried out at the same time in the banks BA and BB.

Figure 7:
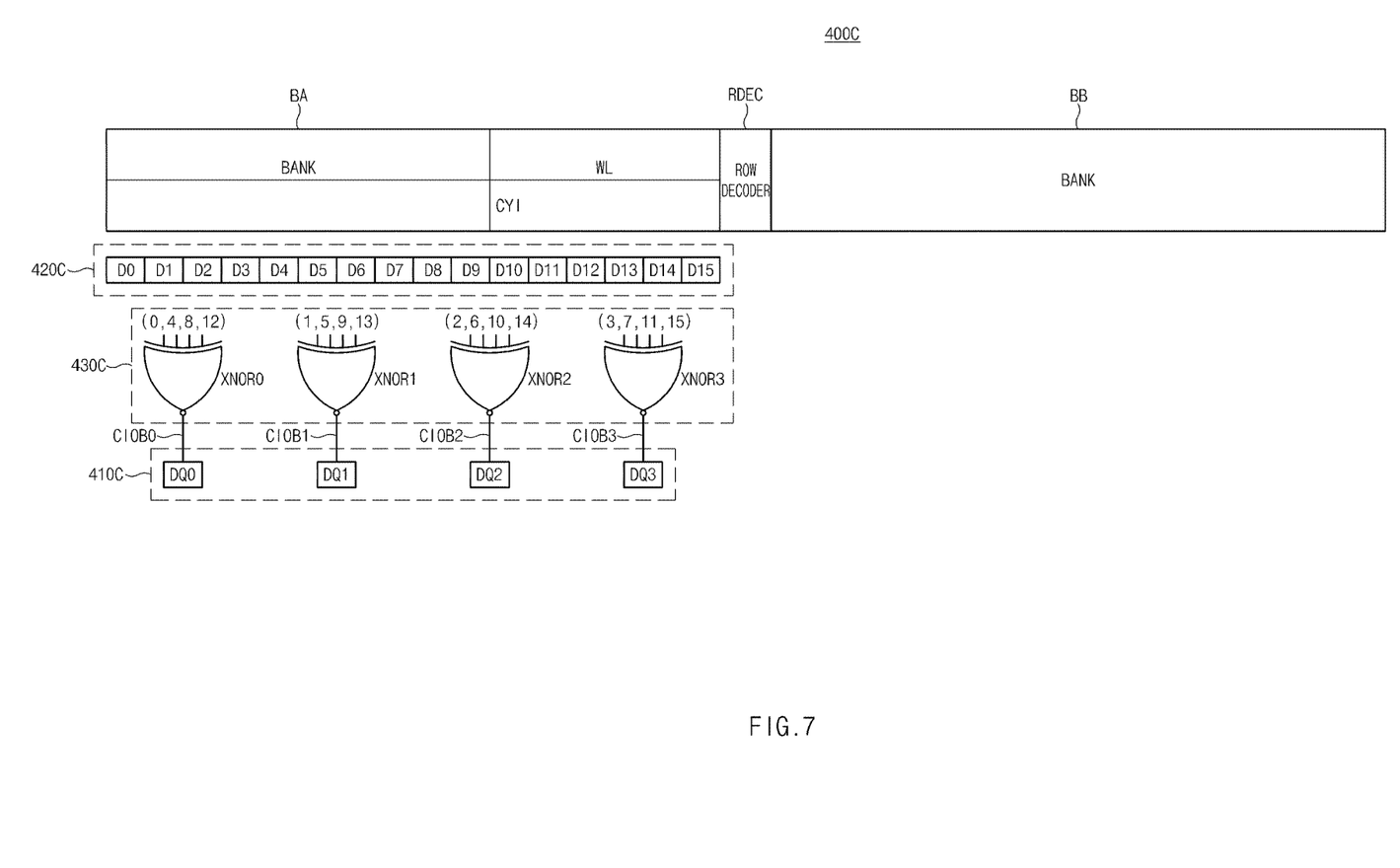
FIG. 7 illustrates a memory core shown in FIG. 3 according to another embodiment of the present disclosure.

FIG. 7 illustrates another example of the memory core 400 shown in FIG. 3 according to an embodiment of the present disclosure.

Referring to FIG. 7, a memory core 400C may include a data I/O circuit 410C, a data driver 420C, a data compression circuit 430C, a row decoder RDEC, and banks BA and BB.

The embodiment of FIG. 7 will hereinafter be described focusing upon a read operation of data for convenience of description. The embodiment of FIG. 7 discloses an exemplary case in which the control signal CON from the controller 200 shown in FIG. 2 is set to the compression mode.

The memory core 400C may compress data read from the bank BA, and may transmit the compressed data to the data bus DB2 through the interface 300 shown in FIG. 2. The embodiment of FIG. 7 discloses that data is read from the bank BA from among the banks BA and BB. However, the scope or spirit of the present disclosure is not limited thereto, and data stored in the bank BB from among the banks BA and BB may be read or data stored in the banks BA and BB may be read, as necessary.

For example, in the compression mode, data denoted by (×16), which is read from the bank BA, may be compressed, such that the compressed data may be output to the interface 300. It is assumed that data applied to the data bus DB1 is denoted by (×12) and data applied to the data bus DB2 is denoted by (×4). As a result, the interface 300 may transmit the compressed data denoted by (×4) to the data bus DB2.

In the bank BA, a word line WL may be selected by the row decoder RDEC, and a column line may be selected by a column selection signal CYI, such that data D0~D15 stored in corresponding cells of the bank BA may be output to the data driver 420C. In this case, the 16 data D0~D15 may be output from the bank BA.

The data D0~D15 output from the data driver 420C may be applied to the data compression circuit 430C. The data compression circuit 430C may compress the output data D0~D15, and may output the compressed data to common I/O buses CIOB0~CIOB3. In this case, the data compression circuit 430C may include a plurality of exclusive-NOR (XNOR) gates XNOR0~XNOR3 respectively coupled to the common I/O buses CIOB0~CIOB3.

The XNOR gate XNOR0 may perform an XNOR operation on the data D0, D4, D8, and D12 selected from among the 16 data D0~D15, and may output the XNOR operation result of the selected data D0, D4, D8, and D12 to the common I/O bus CIOB0. The XNOR gate XNOR1 may perform an XNOR operation on the data D1, D5, D9, and D13 selected from among the 16 data D0~D15, and may output the XNOR operation result of the selected data D1, D5, D9, and D13 to the common I/O bus CIOB1. The XNOR gate XNOR2 may perform an XNOR operation on the data D2, D6, D10, and D14 selected from among the 16 data D0~D15, and may output the XNOR operation result of the selected data D2, D6, D10, and D14 to the common I/O bus CIOB2. The XNOR gate XNOR3 may perform an XNOR operation on the data D3, D7, D11, and D15 selected from among the 16 data D0~D15, and may output the XNOR operation result of the selected data D3, D7, D11, and D15 to the common I/O bus CIOB3.

The data I/O circuit 410C may transmit, as four data DQ0~DQ3, the XNOR operations results received through the common I/O buses CIOB0~CIOB3 to the data bus DB2.

Figure 8:
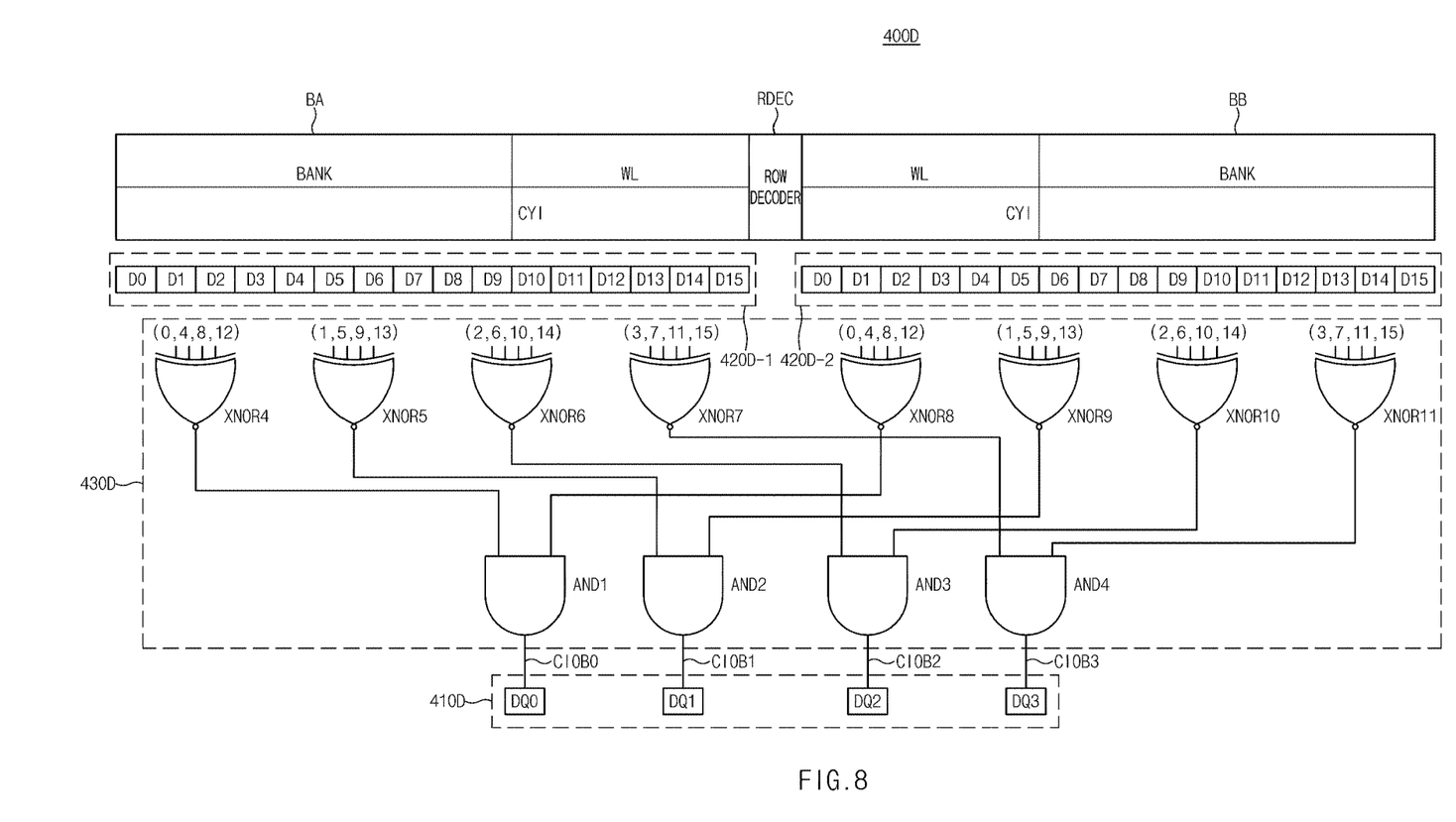
FIG. 8 illustrates a memory core shown in FIG. 3 according to another embodiment of the present disclosure.

FIG. 8 illustrates another example of the memory core 400 shown in FIG. 3 according to an embodiment of the present disclosure.

Referring to FIG. 8, a memory core 400D may include a data I/O circuit 410D, data drivers 420D-1 and 420D-2, a data compression circuit 430D, a row decoder RDEC, and banks BA and BB.

The embodiment of FIG. 8 will hereinafter be described focusing upon a read operation of data for convenience of description. In addition, the embodiment of FIG. 8 discloses an exemplary case in which the control signal CON from the controller 200 shown in FIG. 2 is set to the compression mode.

The memory core 400D may compress data read from the banks BA and BB, and may transmit the compressed data to the data bus DB2 through the interface 300 shown in FIG. 2. The embodiment of FIG. 8 discloses that data is read from the banks BA and BB.

For example, in the compression mode, a sum of data denoted by (×16) read from the first bank BA and data denoted by (×16) read from the second bank BB is acquired, and the sum of data, i.e., data denoted by (×32), may be output to the data compression circuit 430D. For example, it is assumed that data applied to the data bus DB1 is denoted by (×12) and data applied to the data bus DB2 is denoted by (×4). As a result, the data compression circuit 430D may compress the data denoted by (×32) to thereby generate compressed data denoted by (×4), and may transmit the compressed data denoted by (×4) to the data bus DB2 through the interface 300.

In the bank BA, a word line WL may be selected by the row decoder RDEC, and a column line may be selected by a column selection signal CYI, such that data D0~D15 stored in corresponding cells of the bank BA may be output to the data driver 420D-1. In this case, the first 16 data D0~D15 may be output from the bank BA to the data driver 420D-1.

In the bank BB, a word line WL may be selected by the row decoder RDEC, and a column line may be selected by a column selection signal CYI, such that data D0~D15 stored in corresponding cells of the bank BB may be output to the data driver 420D-2. In this case, the second 16 data D0~D15 may be output from the bank BB to the data driver 420D-2.

The data D0~D15 read from each of the banks BA and BB may be driven by each of the data drivers 420D-1 and 420D-2, such that the data D0~D15 from each of the data drivers 420D-1 and 420D-2 may be applied to the data compression circuit 430D. The data compression circuit 430D may compress the data D0~D15 read from each of the banks BA and BB, and may output the compressed data to common I/O buses CIOB0~CIOB3.

The data compression circuit 430D may include a plurality of XNOR gates XNOR4~XNOR11 and a plurality of AND gates AND1~AND4. The XNOR gate XNOR4 may perform an XNOR operation on the data D0, D4, D8, and D12 selected from among the first data D0~D15 read from the bank BA, and may output the XNOR operation result of the selected data D0, D4, D8, and D12 to the AND gate AND1. The XNOR gate XNOR5 may perform an XNOR operation on the data D1, D5, D9, and D13 selected from among the first data D0~D15 read from the bank BA, and may output the XNOR operation result of the selected data D1, D5, D9, and D13 to the AND gate AND2. The XNOR gate XNOR6 may perform an XNOR operation on the data D2, D6, D10, and D14 selected from among the first data D0~D15 read from the bank BA, and may output the XNOR operation result of the selected data D2, D6, D10, and D14 to the AND gate AND3. The XNOR gate XNOR7 may perform an XNOR operation on the data D3, D7, D11, and D15 selected from among the first data D0~D15 read from the bank BA, and may output the XNOR operation result of the selected data D3, D7, D11, and D15 to the AND gate AND4.

The XNOR gate XNOR8 may perform an XNOR operation on the data D0, D4, D8, and D12 selected from among the second data D0~D15 read from the bank BB, and may output the XNOR operation result of the selected data D0, D4, D8, and D12 to the AND gate AND1. The XNOR gate XNOR9 may perform an XNOR on the data D1, D5, D9, and D13 selected from among the second data D0~D15 read from the bank BB, and may output the XNOR operation result of the selected data D1, D5, D9, and D13 to the AND gate AND2. The XNOR gate XNOR10 may perform an XNOR operation on the data D2, D6, D10, and D14 selected from among the second data D0~D15 read from the bank BB, and may output the XNOR operation result of the selected data D2, D6, D10, and D14 to the AND gate AND3. The XNOR gate XNOR11 may perform an XNOR operation on the data D3, D7, D11, and D15 selected from among the second data D0~D15 read from the bank BB, and may output the XNOR operation result of the selected data D3, D7, D11, and D15 to the AND gate AND4.

The AND gate AND1 may perform an AND operation on output signals of the XNOR gates XNOR4 and XNOR8, and may output the AND operation result to the common I/O bus CIOB0. The AND gate AND2 may perform an AND operation on output signals of the XNOR gates XNOR5 and XNOR9, and may output the AND operation result to the common I/O bus CIOB1. The AND gate AND3 may perform an AND operation on output signals of the XNOR gates XNOR6 and XNOR10, and may output the AND operation result to the common I/O bus CIOB2. The AND gate AND4 may perform an AND operation on output signals of the XNOR gates XNOR7 and XNOR11, and may output the AND operation result to the common I/O bus CIOB3.

The data output circuit 410D may receive the compressed data from the common I/O buses CIOB0~CIOB3, and may output, as four data DQ0~DQ3, the compressed data to the data bus DB2 through the interface 300.

As described above, the embodiment of the present disclosure may compress the first and second data D0~D15 read from the banks BA and BB instead of outputting all the first and second data D0~D15, such that data less than all the first and second data D0~D15 can be output. Therefore, in this case, during data transmission, a data loading time can be reduced and a data transfer rate can be increased, resulting in reduction in power consumption.

Figure 9:
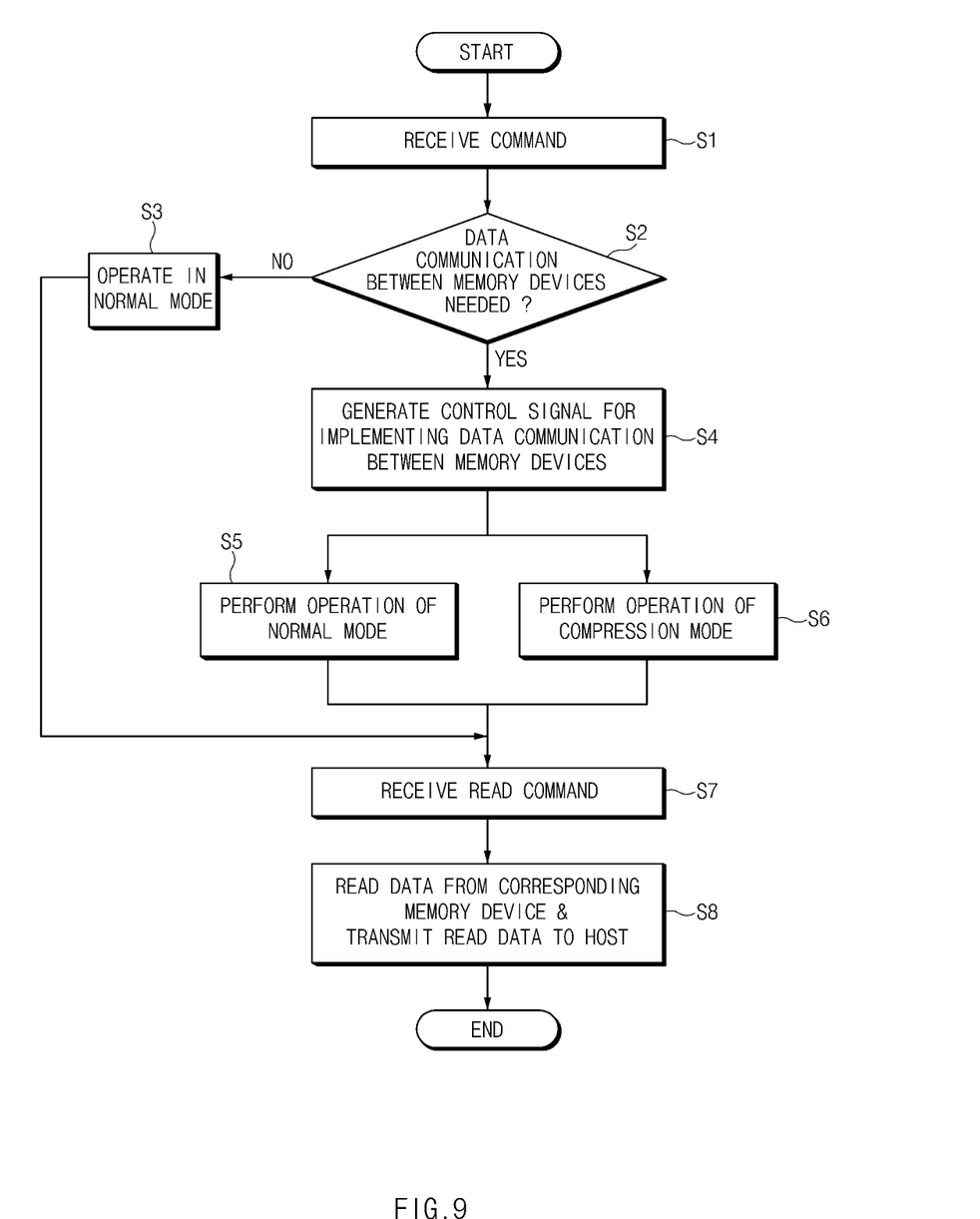
FIG. 9 is a flowchart illustrating operations of a memory system according to an embodiment of the present disclosure.

FIG. 9 is a flowchart illustrating operations of a memory system according to an embodiment of the present disclosure. The operations of FIG. 9 will be described with reference to FIGS. 1 and 2.

Referring to FIG. 9, the memory controller 100 may receive a command from the host (Step S1). The memory controller 110 may analyze the command received from the host, and may determine whether an operation for directly transmitting data between the memory devices M1~M4 is needed (Step S2). For example, if power consumption needs to be reduced, if an operation speed of each memory device needs to be increased, or if reliability of each memory device needs to be improved, the memory controller 100 may determine that data transmission among the memory devices M1~M4 is needed.

If the data transmission among the memory devices M1~M4 needs not be carried out, each of the memory devices M1~M4 may operate in a normal mode (Step S3). On the other hand, when the memory controller 100 receives a command for implementing the data transmission among the memory devices M1~M4, the memory controller 100 may generate the memory control signal MCON corresponding to the data transmission based on the received command (Step S4).

Upon receiving a write command or a read command from the host, the memory controller 100 may transmit the memory control signal MCON for executing the write command or the read command to a controller of each of the memory devices M1~M4. In response to the memory control signal MCON, the controller of each of the memory devices M1~M4 may determine whether a current mode is a normal mode for transmitting the entire data transmitted through the data buses DB1 and DB2 to the corresponding one of the memory devices M1~M4 or is a compression mode for transmitting some of the entire data to the corresponding one of the memory devices M1~M4.

If the current mode is the normal mode for transmitting the entire data, each of the memory devices M1~M4 may operate in the normal mode (Step S5). On the other hand, if the current mode is the compression mode, the controller of each of the memory devices M1~M4 may generate the control signal CON for transmitting data transmitted through the data bus DB2 to the memory core of the corresponding memory device. Each of the memory devices M1~M4 may operate in the compression mode in response to the control signal CON (Step S6).

In this case, a reference memory device and a target memory device may operate independently from each other. For example, when the reference memory device, for example, the memory device M1, is processing the entire data transmitted through the data buses DB1 and DB2 during the normal mode, the target memory device, for example, the memory device M2, may copy some of the entire data, which is transmitted through the data bus DB2, in the compression mode. In some embodiments, the operation of accessing the reference memory device and the operation of accessing the target memory device may be carried out simultaneously or successively.

In an embodiment, when the operation of accessing the reference memory device and the operation of accessing the target memory device may be carried out successively, data, which has been read from the reference memory device, may be transmitted to the target memory device through the data bus DB2. Accordingly, the target memory device may store the data read from the reference memory device.

Thereafter, when the memory controller 100 receives a read command from the host (Step S7), the memory controller 100 may transmit data read from a corresponding memory device from among the memory devices M1~M4 to the host (Step S8).

As is apparent from the above description, the memory system according to the embodiments of the present disclosure may increase a data transfer rate while simultaneously reducing power consumption.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A memory system comprising:
a memory controller configured to generate a memory control signal for controlling a read operation or a write operation of data; and
a plurality of memory devices configured to perform the read operation or the write operation in response to the memory control signal,
wherein the plurality of memory devices includes a first memory device and a second memory device,
wherein the first memory device stores a first number of data received from the memory controller, and
wherein the second memory device receives a second number of data corresponding to a specific number of data from among the first number of data, copies the second number of data to generate a third number of data, and stores the third number of data in the second memory device, the third number of data being greater than the second number of data.

2. The memory system according to claim 1, wherein the plurality of memory devices is configured to perform direct data transmission among the memory devices.

3. The memory system according to claim 1, wherein the plurality of memory devices is coupled to the memory controller through a first data bus and a second data bus.

4. The memory system according to claim 3, wherein the plurality of memory devices is configured to share the second number of data through the second data bus.

5. The memory system according to claim 1, wherein the first memory device and the second memory device are configured to operate independently from each other.

6. The memory system according to claim 1, wherein the first memory device and the second memory device are configured to operate successively.

7. The memory system according to claim 1, wherein the first number of data is identical to the second number of data.

8. The memory system according to claim 1, wherein each of the plurality of memory devices includes:
a controller configured to generate a control signal for determining a control mode of data in response to the memory control signal;
an interface configured to interface with the memory controller in response to the control signal; and
a memory core configured to store data received through the interface or to output stored data to the interface.

9. The memory system according to claim 8, wherein:
when the control signal is set to a normal mode, the interface transmits the first number of data to the memory core; and
when the control signal is set to a compression mode, the interface transmits the second number of data to the memory core.

10. The memory system according to claim 8, wherein the memory core includes:
a data input/output (I/O) circuit configured to perform interfacing of the data with the interface;
a data driver configured to drive the data; and
one or more banks configured to store the data during the write operation, and output the stored data during the read operation.

11. The memory system according to claim 10, wherein the memory core further includes:
a common input/output (I/O) bus configured to transmit the second number of data received through the data input/output (I/O) circuit.

12. The memory system according to claim 11, wherein the memory core further includes:
an internal input/output (I/O) bus configured to copy the second number of data received through the common input/output (I/O) bus, and transmit the third number of data to the data driver.

13. The memory system according to claim 10, wherein the memory core copies the second number of data received through the data input/output (I/O) circuit and stores the third number of data in a plurality of banks.

14. The memory system according to claim 10, wherein the memory core further includes:
a data compression circuit configured to compress the data received from the data driver during the read operation, and transmit the compressed data to the data input/output (I/O) circuit.

15. The memory system according to claim 14, wherein the data compression circuit compresses data received from a plurality of banks, and transmits the compressed data to the data input/output (I/O) circuit.

16. A memory system comprising:
a first memory device configured to perform a read operation or a write operation of data in response to a memory control signal, and store a first number of data received through a first data bus and a second data bus; and
a second memory device configured to receive, through the second data bus, a second number of data corresponding to a specific number of data from among the first number of data from the first memory device, copy the second number of data to generate a third number of data, and store the third number of data in the second memory device, the third number of data being greater than the second number of data.

17. The memory system according to claim 16, wherein each of the first memory device and the second memory device includes:
a controller configured to generate a control signal for determining a control mode of data in response to the memory control signal;
an interface configured to interface with a memory controller in response to the control signal; and
a memory core configured to store data received through the interface or to output stored data to the interface.

18. The memory system according to claim 17, wherein, in the second memory,
when the control signal is set to a normal mode, the interface transmits data corresponding to the first number of data to the memory core; and
when the control signal is set to a compression mode, the interface transmits the second number of data to the memory core.

19. The memory system according to claim 18, wherein the memory core includes:
a data input/output (I/O) circuit configured to perform interfacing of data with the interface;
a data driver configured to drive data from one or more banks or data from the data I/O circuit;
a data compression circuit configured to compress the data received through the data driver during the read operation, and transmit the compressed data to the data input/output (I/O) circuit; and
the one or more banks configured to store the data received from the data drive during the write operation, and output stored data to the data driver during the read operation.

20. The memory system according to claim 19, wherein the memory core further includes:
a common input/output (I/O) bus configured to transmit the second number of data received through the data input/output (I/O) circuit; and
an internal input/output (I/O) bus configured to copy the second number of data received through the common input/output (I/O) bus, and transmit the third number of data to the data driver.

* * * * *